United States Patent
Matsubara et al.

(10) Patent No.: US 12,327,689 B2
(45) Date of Patent: Jun. 10, 2025

(54) CAPACITOR HAVING A THROUGH-HOLE EXPOSING AN ELECTRODE AND AT LEAST ONE PROTRUSION IN THE THROUGH-HOLE

(71) Applicant: Murata Manufacturing Co., Ltd., Nagaokakyo (JP)

(72) Inventors: Hiroshi Matsubara, Nagaokakyo (JP); Masatomi Harada, Nagaokakyo (JP); Takeshi Kagawa, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 700 days.

(21) Appl. No.: 17/516,774

(22) Filed: Nov. 2, 2021

(65) Prior Publication Data

US 2022/0059290 A1    Feb. 24, 2022

Related U.S. Application Data

(63) Continuation of application No. PCT/JP2020/008961, filed on Mar. 3, 2020.

(30) Foreign Application Priority Data

May 13, 2019    (JP) .................. 2019-090617

(51) Int. Cl.
  *H01G 4/30*    (2006.01)
  *H01G 2/10*    (2006.01)
  (Continued)

(52) U.S. Cl.
  CPC ............ *H01G 4/30* (2013.01); *H01G 4/35* (2013.01); *H10D 1/692* (2025.01); *H01G 2/10* (2013.01)

(58) Field of Classification Search
  CPC .. H01G 4/30; H01G 4/35; H01G 2/10; H01G 4/008; H01G 4/01; H01G 4/33; H01L 28/60
  See application file for complete search history.

(56) References Cited

U.S. PATENT DOCUMENTS 6,646,323 B2 * 11/2003 Dirnecker ........... H01L 23/5223
                                                         257/532
2006/0180938 A1 * 8/2006 Kurihara ............. H01L 21/4857
                                                         257/E23.079
(Continued)

FOREIGN PATENT DOCUMENTS

JP    H06302466 A    10/1994
JP    2007081325 A    3/2007
(Continued)

OTHER PUBLICATIONS

International Search Report issued for PCT/JP2020/008961, date of mailing Jun. 16, 2020.
(Continued)

*Primary Examiner* — Timothy J. Dole
*Assistant Examiner* — Daniel M Dubuisson
(74) *Attorney, Agent, or Firm* — ArentFox Schiff LLP (57) ABSTRACT

A capacitor that includes a substrate having a surface; a lower electrode opposing the surface of the substrate; a dielectric film on the lower electrode; an upper electrode on the dielectric film; a protective layer on the lower electrode, the dielectric film, and the upper electrode, the protective layer defining a through-hole exposing at least one of the lower electrode and the upper electrode; at least one protrusion in the through-hole; and an outer electrode covering the through-hole and the at least one protrusion.

19 Claims, 9 Drawing Sheets

(51) Int. Cl.
*H01G 4/35* (2006.01)
*H10D 1/68* (2025.01)

(56) References Cited

U.S. PATENT DOCUMENTS

| | | | |
|---|---|---|---|
| 2006/0202346 A1* | 9/2006 | Shih | H01L 23/53238 |
| | | | 257/774 |
| 2007/0176175 A1* | 8/2007 | Shioga | H01L 24/05 |
| | | | 257/40 |
| 2007/0246799 A1* | 10/2007 | Kawano | H01L 21/7684 |
| | | | 257/532 |
| 2010/0178878 A1 | 7/2010 | Kurioka | |
| 2013/0120905 A1* | 5/2013 | Son | H01F 17/0033 |
| | | | 427/126.6 |
| 2016/0190082 A1* | 6/2016 | Tsai | H01L 23/49822 |
| | | | 257/737 |
| 2016/0322164 A1* | 11/2016 | Shindo | H01L 28/60 |
| 2017/0309404 A1 | 10/2017 | Watanabe et al. | |
| 2018/0040422 A1* | 2/2018 | Shin | H01G 4/30 |
| 2018/0182836 A1* | 6/2018 | Beak | H10K 59/1216 |
| 2019/0103227 A1* | 4/2019 | Lu | H01G 4/224 |
| 2019/0122820 A1 | 4/2019 | Harada et al. | |
| 2019/0157006 A1* | 5/2019 | Han | H01G 4/008 |
| 2019/0306982 A1* | 10/2019 | Nagaoka | H05K 3/027 |
| 2019/0392992 A1* | 12/2019 | Kumagae | H05K 1/09 |
| 2020/0082989 A1 | 3/2020 | Kagawa et al. | |
| 2020/0343049 A1* | 10/2020 | Paital | H01G 4/38 |

FOREIGN PATENT DOCUMENTS

| | | |
|---|---|---|
| JP | 2008252011 A * | 10/2008 |
| JP | 2017195322 A | 10/2017 |
| WO | 2008149622 A1 | 12/2008 |
| WO | 2018003445 A1 | 1/2018 |
| WO | 2019026641 A1 | 2/2019 |

OTHER PUBLICATIONS

Written Opinion of the International Searching Authority issued for PCT/JP2020/008961, date of mailing Jun. 16, 2020.

* cited by examiner

«CAPACITOR HAVING A THROUGH-HOLE EXPOSING AN ELECTRODE AND AT LEAST ONE PROTRUSION IN THE THROUGH-HOLE»

CAPACITOR HAVING A THROUGH-HOLE EXPOSING AN ELECTRODE AND AT LEAST ONE PROTRUSION IN THE THROUGH-HOLE

CROSS REFERENCE TO RELATED APPLICATIONS

The present application is a continuation of International application No. PCT/JP2020/008961, filed Mar. 3, 2020, which claims priority to Japanese Patent Application No. 2019-090617, filed May 13, 2019, the entire contents of each of which are incorporated herein by reference.

FIELD OF THE INVENTION

The present disclosure relates to a capacitor.

BACKGROUND OF THE INVENTION

A metal-insulator-metal (MIM) capacitor is well known as an example of a typical capacitor element included in a semiconductor integrated circuit. A MIM capacitor is a capacitor with a parallel-plate structure including an insulator held between a lower electrode and an upper electrode.

Figure 10:
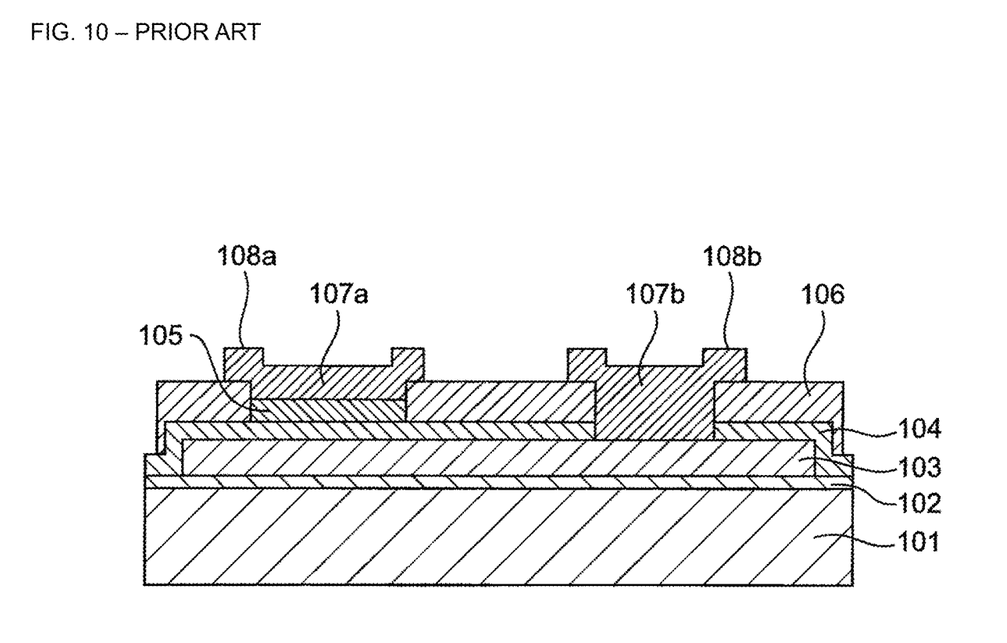
FIG. 10 is a cross-sectional view of a structure of an existing MIM capacitor.

For example, Patent Document 1 discloses, as in FIG. 10, a capacitor including a substrate 101, and an insulator film 102, a lower electrode 103, a dielectric film 104, and an upper electrode 105 sequentially disposed on the substrate 101. A protective layer 106 is disposed on these components. One outer electrode 107a extends through the protective layer 106 to be connected to the upper electrode 105, and an outer electrode 107b extends through the protective layer 106 to be connected to the lower electrode 103. In this capacitor, edge portions 108a and 108b of the outer electrodes 107a and 107b can have a protruding shape reflecting the shape of the through-holes in the underlying protective layer 106.

Patent Document 1: International Publication No. 2018/003445

SUMMARY OF THE INVENTION

As described above, in the capacitor described in Patent Document 1, an edge portion of each outer electrode can have a protruding shape reflecting the shape of the through-hole in the underlying protective layer. The size reduction of a chip inevitably involves size reduction of the outer electrode, and hinders secure mounting workability.

Thus, the present disclosure aims to provide a MIM capacitor with high mounting workability.

The present disclosure is directed to a capacitor that includes a substrate having a surface; a lower electrode opposing the surface of the substrate; a dielectric film on the lower electrode; an upper electrode on the dielectric film; a protective layer on the lower electrode, the dielectric film, and the upper electrode, the protective layer defining a through-hole exposing at least one of the lower electrode and the upper electrode; at least one protrusion in the through-hole; and an outer electrode covering the through-hole and the at least one protrusion.

The present disclosure can provide a MIM capacitor with high mounting workability.

BRIEF DESCRIPTION OF THE DRAWINGS

FIG. 1(b) is a plan view of the capacitor 1a.

DETAILED DESCRIPTION OF THE PREFERRED EMBODIMENTS

A capacitor of the present disclosure will be described in detail below with reference to the drawings. The details of the capacitor of the present disclosure and components such as the shape and arrangement of each component are not limited to the examples in the drawings.

First Embodiment

Figure 1A:
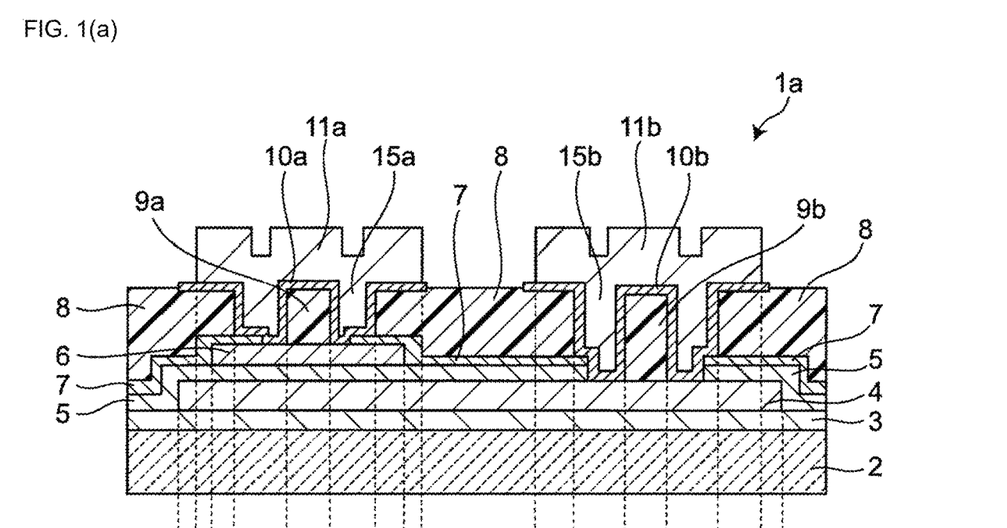
FIG. 1(a) is a cross-sectional view of a capacitor 1a according to a first embodiment of the present disclosure.
Figure 1B:
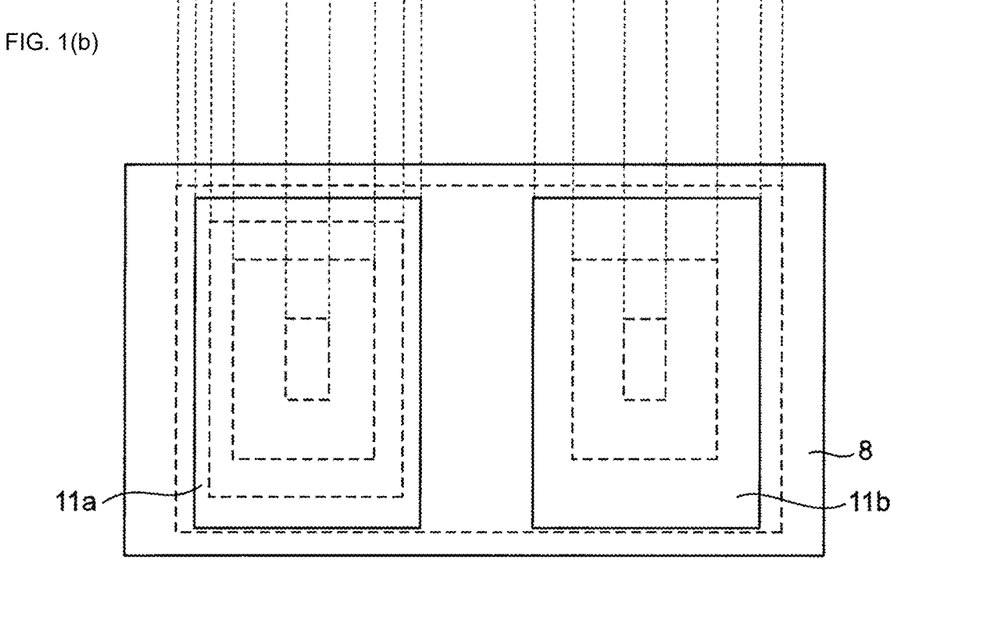

FIG. 1(a) is a cross-sectional view of a capacitor 1a according to the first embodiment, and FIG. 1(b) is a plan view of the capacitor 1a.

As illustrated in FIGS. 1(a) and 1(b), the capacitor 1a according to the present embodiment mainly includes a substrate 2, an insulator film 3 disposed on the substrate 2, a lower electrode 4 disposed on the insulator film 3, a dielectric film 5 disposed on the lower electrode 4, an upper electrode 6 disposed on the dielectric film 5, a moisture-resistant film 7 disposed on the dielectric film 5 and the upper electrode 6, a protective layer 8 disposed on the moisture-resistant film 7 and having through-holes 15a and 15b, protrusions 9a and 9b respectively disposed in the through-holes 15a and 15b, seed layers 10a and 10b disposed on side surfaces of the through-holes 15a and 15b and on the protrusions 9a and 9b, and outer electrodes 11a and 11b disposed on the seed layers 10a and 10b. In the capacitor 1a, the lower electrode 4, the dielectric film 5, and the upper electrode 6 are laminated in this order to form a MIM capacitor structure. When a voltage is applied across the lower electrode 4 and the upper electrode 6, the dielectric film 5 can accumulate electric charges. On the side near the outer electrode 11a, current flows in order of the outer electrode 11a, the seed layer 10a, and the upper electrode 6 (or in reverse order). On the side near the outer electrode 11b, current flows in order of the outer electrode 11b, the seed layer 10b, and the lower electrode 4 (or in reverse order).

In a plan view, the protrusions 9a and 9b are disposed at the respective center portions of the through-holes 15a and 15b. Herein, "the plan view" is a top view of the main surface of the substrate of the capacitor viewed perpendicularly from the outer electrode. The outer electrodes 11a and 11b are disposed to extend to the area outside of the through-holes 15a and 15b. In other words, the outer electrodes 11a and 11b cover the protrusions 9a and 9b, fill in the through-holes 15a and 15b, and extend over part of the protective layer 8 outside of the through-holes. The portion of each outer electrode over the protective layer and the portion of each outer electrode over the protrusion have a protruding shape. In other words, a peripheral portion and a center portion of each of the outer electrodes 11a and 11b have a protruding shape, and the surface of the outer electrode has an uneven shape as a whole. The internal edge of the protruding peripheral portion of each of the outer electrodes 11a and 11b is located inward from the inner wall of the corresponding through-hole 15a or 15b. The protruding center portion of each of the outer electrodes 11a and 11b is located outward from the corresponding protrusion 9a or 9b. Unlike an existing capacitor, the capacitor of the present disclosure has many projections and depressions on the surface of the outer electrode, and thus has a larger connection area for being mounted with solder. The capacitor of the present disclosure thus has a large connection area, and has high mounting workability. In an existing capacitor illustrated in FIG. 10, when a load is imposed on the outer electrodes, such as during mounting, the load may be concentrated on the protruding portions located at the peripheral portion of the outer electrode, and the capacitor may degrade the load-carrying capacity. On the other hand, the capacitor of the present disclosure has protruding portions at not only the peripheral portion but also the center portion. Thus, the load is dispersed to the center portion in addition to the peripheral portion, and thus the capacitor has higher load-carrying capacity.

In a plan view, the outer electrode 11a is disposed within an area where the upper electrode 6 is disposed, and the outer electrodes 11a and 11b and the upper electrode 6 are disposed within an area where the lower electrode 4 is disposed. This arrangement of the outer electrodes, the upper electrodes, and the lower electrode with these shapes can reduce stray capacitance, and enhance the accuracy of the capacitance of the capacitor 1a.

The above capacitor 1a is manufactured in, for example, the following manner. Although attention is focused on one capacitor element in the following description and in FIG. 9, actually, multiple capacitor elements are concurrently manufactured on the substrate. More specifically, a collective board including multiple capacitors is manufactured, and finally divided into capacitors.

First, the substrate 2 is prepared.

Although not particularly limited, the substrate 2 can be, preferably, a semiconductor substrate such as a silicon substrate or a gallium arsenide substrate, or an insulating substrate made of, for example, glass or alumina.

The thickness of the substrate 2 is not particularly limited, but preferably 50 µm to 300 µm, or more preferably 80 µm to 200 µm. The substrate with a thickness of 50 µm or larger can improve the mechanical strength. Thus, during manufacturing of the capacitor, the substrate is less likely to be broken or chipped while being subjected to back grinding or dicing. The substrate with a thickness of 300 µm or less can have a thickness smaller than the length and width of the capacitor, and facilitates handling of the capacitor during mounting of the capacitor.

Subsequently, the insulator film 3 is placed over the entirety of the substrate 2 (FIG. 9(a)).

In the present embodiment, the insulator film 3 is disposed to cover the entirety of the substrate 2.

The insulator film 3 can be formed by, for example, sputtering or chemical vapor deposition (CVD).

The insulator film 3 may be any thickness that can insulate the substrate 2 from a layer disposed on the insulator film, and for example, 0.05 µm or larger, or more preferably, 0.10 µm or larger. In view of the height reduction of the capacitor 1a, the thickness of the insulator film 3 is preferably 10 µm or smaller, more preferably 1.0 µm or smaller, or further more preferably, 0.50 µm or smaller.

Although the material of the insulator film 3 is not particularly limited, preferable examples include $SiO_2$, $Si_3N_4$, $Al_2O_3$, $HfO_2$, $Ta_2O_5$, and $ZrO_2$. Among these materials, $SiO_2$, $Si_3N_4$, or $Al_2O_3$ is more preferable.

Figure 9A:
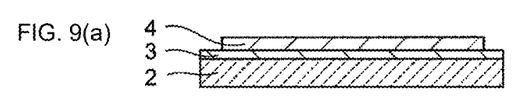
FIGS. 9(a) to 9(i) are cross-sectional views for illustrating a method for manufacturing the capacitor 1a according to the first embodiment of the present disclosure.

Thereafter, a pattern of the lower electrode 4 is formed on the insulator film 3 (FIG. 9(a)).

In the present embodiment, the lower electrode 4 is disposed on the insulator film 3 in an area of the insulator film 3 other than the peripheral portion. In other words, when viewed in a plan, the lower electrode 4 is disposed on the area further inward from the area occupied by the substrate 2 and the insulator film 3. Forming the lower electrode 4 without extending to the edges of the insulator film and the substrate prevents the lower electrode 4 from being exposed at the end surfaces of the capacitor 1a and establishing a short circuit with another component.

A pattern of the lower electrode 4 may be formed by, for example, lift-off, plating, sputtering, vapor deposition, photolithography, or etching. For example, the patterning may be performed by a combination of sputtering, photolithography, and etching.

The thickness of the lower electrode 4 is not particularly limited, but preferably 0.5 µm to 10 µm, or more preferably 1 µm to 6 µm. The lower electrode with a thickness of 0.5 µm or larger can reduce the resistance of the electrode, and can reduce the effect on high-frequency characteristics of the capacitor. The lower electrode with a thickness of 10 µm or less can prevent degrading of mechanical strength of the element due to the stress of the electrode, and thus can prevent deformation of the capacitor.

The material of the lower electrode 4 is not particularly limited, but may preferably be CU, Ag, Au, Al, Ni, Cr, or Ti, an alloy of any of these metals, or a conductor containing any of these metals and alloys, or more preferably, Cu, Ag, Au, or Al.

Figure 9B:
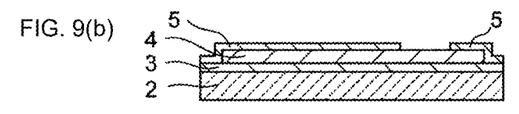

Subsequently, a pattern of the dielectric film 5 is formed on the lower electrode 4 (FIG. 9(b)).

In the present embodiment, the dielectric film 5 is disposed over the entirety of the substrate to cover the lower electrode 4. However, the dielectric film 5 does not lie in the area where the outer electrode 11b and the lower electrode 4 are to be connected to each other. The area other than the area where the lower electrode and the outer electrode are to be connected is covered with a dielectric film to prevent the lower electrode from coming into electric contact with unintended members.

The dielectric film 5 may be formed by, for example, sputtering or CVD. Examples of patterning of the dielectric film 5 include photolithography and etching.

Although not particularly limited, the thickness of the dielectric film 5 is preferably 50 nm to 10 µm, or more preferably 0.1 µm to 3.0 µm. The dielectric film with a thickness of 50 nm or larger can enhance dielectric strength. The dielectric film with a thickness of 10 µm or less can prevent degrading of mechanical strength of the element due to the stress of the dielectric film, and thus can prevent deformation of the capacitor.

The material of the dielectric film 5 is not particularly limited, but preferably, for example, any of oxides and nitrides including $SiO_2$, $Si_3N_4$, $Al_2O_3$, $HfO_2$, $Ta_2O_5$, and $ZrO_2$.

Figure 9C:
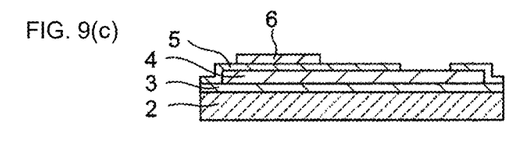

Subsequently, a pattern of the upper electrode 6 is formed on the dielectric film 5 (FIG. 9(c)).

In the present embodiment, the upper electrode 6 is disposed on part of the dielectric film 5. The area on which the upper electrode 6 is disposed forms an electrostatic-capacity forming portion to serve as a capacitor.

A pattern of the upper electrode 6 is formed by, for example, the same method as that for the lower electrode 4, such as, lift-off, plating, sputtering, vapor deposition, photolithography, or etching. For example, the patterning may be performed by a combination of sputtering, photolithography, and etching.

For the same reason as that for the lower electrode 4, the thickness of the upper electrode 6 is not particularly limited, but preferably 0.5 μm to 10 μm, or more preferably 1 μm to 6 μm. The thickness of the upper electrode 6 is preferably smaller than the thickness of the lower electrode 4. The length of the upper electrode 6 is preferably smaller than the length of the lower electrode 4. This is because the lower electrode 4 with a smaller thickness has high equivalent series resistance (ESR).

The material of the upper electrode 6 is not particularly limited, but may preferably be CU, Ag, Au, Al, Ni, Cr, or Ti, an alloy of any of these metals, or a conductor containing any of these metals and alloys, or more preferably, Cu, Ag, Au, or Al.

Figure 9D:
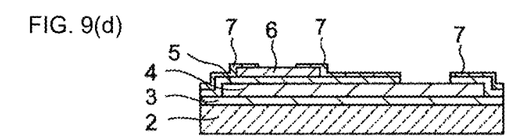

Subsequently, a pattern of the moisture-resistant film 7 is formed on the dielectric film 5 and the upper electrode 6 (FIG. 9(d)).

In the present embodiment, the moisture-resistant film 7 is disposed to cover the dielectric film 5 and the upper electrode 6. However, the moisture-resistant film 7 does not lie in the area where the outer electrode 11a and the upper electrode 6 are to be connected to each other and the area where the outer electrode 11b and the lower electrode 4 are to be connected to each other.

The moisture-resistant film 7 may be formed by, for example, sputtering or CVD. The patterning may be performed by, for example, photolithography or etching.

Although the thickness of the moisture-resistant film 7 is not particularly limited, but preferably 0.5 μm to 10 μm, or more preferably 1 μm to 3 μm. The moisture-resistant film 7 with a thickness of 0.5 μm or larger can be more reliably moisture proof. The moisture-resistant film 7 with a thickness of 10 μm or less can prevent degrading of the mechanical strength due to the stress of the film, and thus can prevent deformation of the capacitor.

The material of the moisture-resistant film 7 is not particularly limited, but may preferably be a moisture-resistant material such as $Si_3N_4$ or $SiO_2$.

Figure 9E:
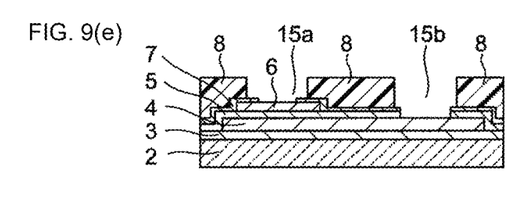

Subsequently, a pattern of the protective layer 8 is formed on the moisture-resistant film 7 (FIG. 9(e)).

In the present embodiment, the protective layer 8 includes the through-holes 15a and 15b for forming the outer electrodes 11a and 11b, and covers the area other than the portions where the through-holes are formed. The through-hole 15a is formed over the upper electrode 6, and the through-hole 15b is formed in an area where the upper electrode 6 does not lie.

The protective layer 8 can be formed by, for example, spin coating. The patterning of the protective layer 8 may be performed by, for example, photolithography or etching.

The thickness of the protective layer 8 is not particularly limited, but may preferably be 1 μm to 20 μm, or more preferably 3 μm to 15 μm. In the protective layer with a thickness of 1 μm or larger, the capacity to hold the protective layer 8 between the outer electrodes 11a and 11b and the lower electrode 4 is smaller than the capacity to hold the dielectric film 5 between the lower electrode 4 and the upper electrode 6, and thus can reduce the effect of voltage fluctuation or frequency characteristics of the capacity holding the protective layer 8 on the entire capacitor. The protective layer 8 with a thickness of 20 μm or less enables use of a low-viscosity material for the protective layer, facilitates the control on the thickness, and enables reduction of the variation in capacitor capacitance.

The material of the protective layer 8 is not particularly limited, but may preferably be a resin material such as polyimide.

Figure 9F:
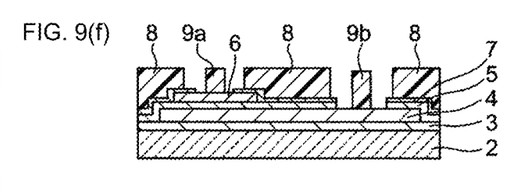

Subsequently, the protrusions 9a and 9b are respectively formed in the through-holes 15a and 15b (FIG. 9(f)).

In the present embodiment, the protrusions 9a and 9b are respectively formed in the through-holes 15a and 15b. Each protrusion is formed in a prism shape at the center portion of the corresponding through-hole.

The height of each protrusion is not particularly limited, but may preferably be 0.5 μm to 20 μm, or more preferably 2 μm to 15 μm. The protrusion with a height of 0.5 μm or larger can enhance the effect of increasing the surface area with the projections and depressions of the outer electrodes. The protrusion with a height of 20 μm or less enables use of a low-viscosity material for the protective layer, facilitates the control on the thickness, and enables reduction of the variance in capacitor capacitance.

In a preferable aspect, the height of the protrusion 9a is equal to the sum of the thicknesses of the moisture-resistant film 7 and the protective layer 8 in the through-hole 15a, and the height of the protrusion 9b is equal to the sum of the thicknesses of the moisture-resistant film 7, the protective layer 8, and the dielectric film 5 in the through-hole 15b. In other words, the upper surface of the protective layer 8 and the upper surfaces of the protrusions 9 are preferably flush with each other.

In another aspect, the upper surface of each protrusion is located higher than the upper surface of the protective layer. In this aspect, the height of each protrusion is preferably 1.1 times of the height of the through-hole to 2.0 times of the height of the through-hole, or more preferably 1.2 times to 1.5 times of the height of the through-hole.

In another aspect, the upper surface of each protrusion is located lower than the upper surface of the protective layer. In this aspect, the height of each protrusion is preferably 0.3 times to 0.9 times of the height of the through-hole, or more preferably 0.5 times to 0.8 times of the height of the through-hole.

The protrusions 9a and 9b may be formed by, for example, sputtering, CVD, or spin coating. Patterns of the protrusions 9a and 9b may be formed by, for example, photolithography or etching.

The protrusions 9a and 9b may be formed after the protective layer 8 is formed. Alternatively, the protective layer 8 may be formed after the protrusions 9a and 9b are formed. Instead, if possible, the protrusions 9a and 9b and the protective layer 8 may be concurrently formed.

The material of the protrusions 9a and 9b is not particularly limited, but may be a resin material such as polyimide, a metal material such as Cu, or an inorganic material such as $SiO_2$. A preferable example of the metal material is a metal with a low Young's modulus. A preferable example of the inorganic material is a moisture-proof inorganic material or an inorganic material with a low Young's modulus.

In one aspect, the material of the protrusions 9a and 9b is a resin material such as polyimide. When a load is imposed on the capacitor 1a where the protrusions are located at the outer electrodes and the MIM structure, the resin material reduces the load on the MIM structure, and improves the impact resistance.

In this aspect, the material of the protrusions 9a and 9b may be the same as the material of the protective layer 8. The protrusions and the protective layer formed from the same material enable concurrent formation of the protective layer and the protrusions.

In one aspect, the material of the protrusions 9a and 9b is a metal material such as Cu. Use of the metal material can increase the contact area of a current path between the outer electrodes and the upper electrode, and can further enhance a Q value. When a load is imposed on the capacitor 1a where the protrusions are located at the outer electrodes and the MIM structure, the metal material with a low Young's modulus reduces the load on the MIM structure, and improves the impact resistance.

In this aspect, the material of the protrusions 9a and 9b is the same as the material of a seed layer, described later. The protrusions and the seed layer formed from the same material enable concurrent formation of the seed and the protrusions, and also reduce contact resistance with reduction of connection between different materials.

In one aspect, the material of the protrusions 9a and 9b is an inorganic material such as $SiO_2$. Use of the moisture-proof inorganic material can prevent corrosion of the upper electrode due to water. When a load is imposed on the capacitor 1a where the protrusions are located at the outer electrodes and the MIM structure, the inorganic material with a low Young's modulus reduces the load on the MIM structure, and improves the impact resistance.

In the example illustrated in the drawings, the protrusions have a quadrangular prism shape. However, the capacitor of the present disclosure is not limited to this example. The protrusions may have any shape, such as a circular cylinder shape or a triangular prism shape.

Figure 9G:
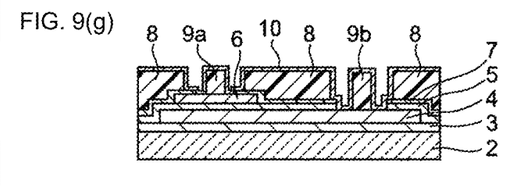

Subsequently, a seed layer 10 is formed on the protective layer 8 and the protrusions 9 (FIG. 9(g)).

In the present embodiment, the seed layer is disposed to cover the protective layer 8, the protrusions, and other layers exposed through the through-holes.

The seed layer may be formed by, for example, sputtering or electroless plating.

The thickness of the seed layer is not particularly limited, but may preferably be 0.5 μm to 10 μm, or more preferably 1 μm to 3 μm. The seed layer with a thickness of 0.5 μm or larger facilitates the following formation of the outer electrodes. The seed layer with a thickness of 10 μm or less prevents degrading of the mechanical strength of the element due to the stress of the seed layer, and can prevent deformation of the capacitor.

The material of the seed layer is not particularly limited to a material, but may preferably be Ti or Cu.

Figure 9H:
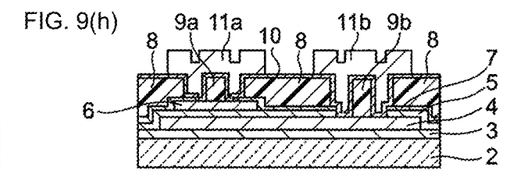

Subsequently, patterns of the outer electrodes 11a and 11b are formed at predetermined portions on the seed layer (FIG. 9(h)).

In the present embodiment, the outer electrodes 11a and 11b are respectively formed to cover the through-holes 15a and 15b and the protrusions 9a and 9b. The outer edge of each outer electrode is located on the upper surface of the protective layer 8. In other words, each outer electrode covers the protrusion, covers the bottom surface and the side surface of the through-hole, and extends to part of the upper surface of the protective layer.

Patterns of the outer electrodes 11a and 11b may be formed by, for example, a semi-additive process.

The material of the outer electrodes 11a and 11b is not particularly limited, but may preferably be Cu or Al.

In a preferable aspect, each outer electrode may include a plated layer formed from, for example, Ni or Au, or more preferably, include an Au plated layer on the outermost surface.

In a preferable aspect, the material of the outer electrodes 11a and 11b is a material with a lower resistivity than the material of the lower electrode 4 and the upper electrode 6, and may be, for example, Cu or Al.

Figure 9I:
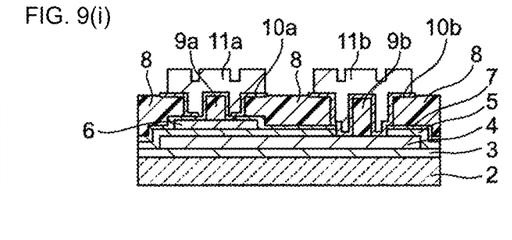

Subsequently, unnecessary portions of the seed layer are removed to prevent the outer electrodes 11a and 11b from being connected to each other with the seed layer (FIG. 9(i)). Thus, the seed layer is divided into the seed layers 10a and 10b located at respective positions of the outer electrodes 11a and 11b. The removal of the seed layer may be performed by, for example, etching.

With the series of processes, a collective board including multiple capacitor elements is manufactured. Such a collective board is subjected to back grinding to be thinned to an intended thickness. Thereafter, the collective board is divided into pieces by, for example, blade dicing, stealth dicing, or plasma dicing. Specifically, the collective board is cut in the size of individual capacitors. Thus, the capacitor 1a of the present disclosure can be obtained.

The capacitor 1a according to the first embodiment is thus manufactured.

The thickness of the entire capacitor 1a (including the substrate 2) thus obtained is preferably 10 μm to 300 μm, or more preferably 20 μm to 200 μm.

Second Embodiment

Figure 2A:
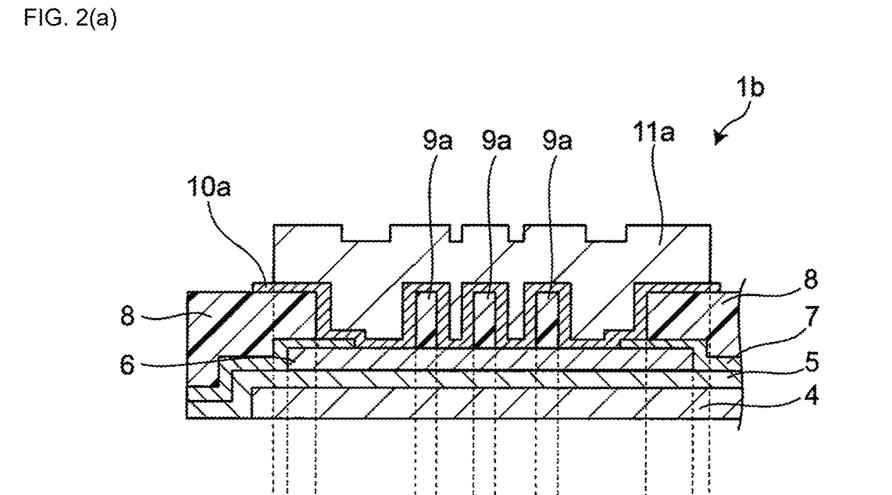
FIG. 2(a) is a cross-sectional view of a capacitor 1b according to a second embodiment of the present disclosure.
Figure 2B:
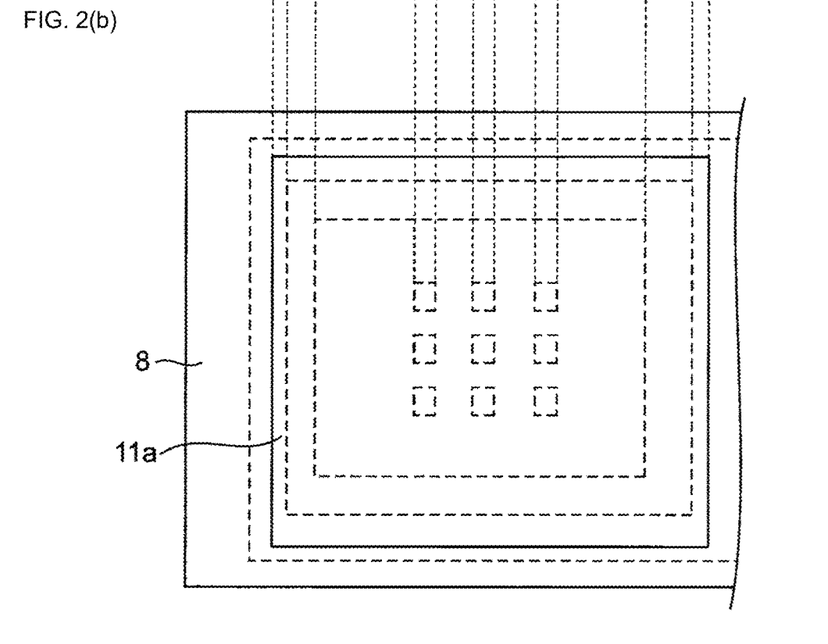
FIG. 2(b) is a plan view of the capacitor 1b.

FIG. 2(a) is a cross-sectional view of a portion of a capacitor 1b according to a second embodiment including the MIM structure, and FIG. 2(b) is a plan view of the capacitor 1b.

As illustrated in FIGS. 2(a) and 2(b), the capacitor 1b according to the second embodiment has the same structure as the capacitor 1a according to the first embodiment except that the capacitor 1b includes multiple protrusions 9a. Although not illustrated, the capacitor 1b may also include multiple protrusions 9b. Providing the multiple protrusions 9a and 9b increases the number of projections and depressions on the surfaces of the outer electrodes 11a and 11b, increases the surface areas of the outer electrodes, and further improves the mounting workability. The capacitor 1b further easily disperses the load imposed on the capacitor 1b, and thus further improves the load-carrying capacity.

In the illustrated example, the same number of protrusions are equidistantly arranged lengthwise and widthwise (that is, three each and nine in total). The outer electrodes similarly have a protruding shape over the protrusions. In the present embodiment, the number and arrangement of the multiple protrusions are not limited to the illustrated example. For example, the number of protrusions may be 2 or more, preferably, 4 or more, or more preferably 9 or more. The protrusions may be arranged in any shape such as in a straight or annular shape.

In a plan view, the areas occupied by the protrusions are within the area of the protruding portions of the outer electrodes.

The distance between the protrusions is preferably 1 μm or larger, more preferably 5 μm or larger, or further more preferably, 10 μm or larger. The protrusions spaced apart from each other by a distance 1 μm or larger can prevent the projections and depressions on the surface of the outer electrodes from being crushed during the formation of the outer electrodes.

Third Embodiment

Figure 3A:
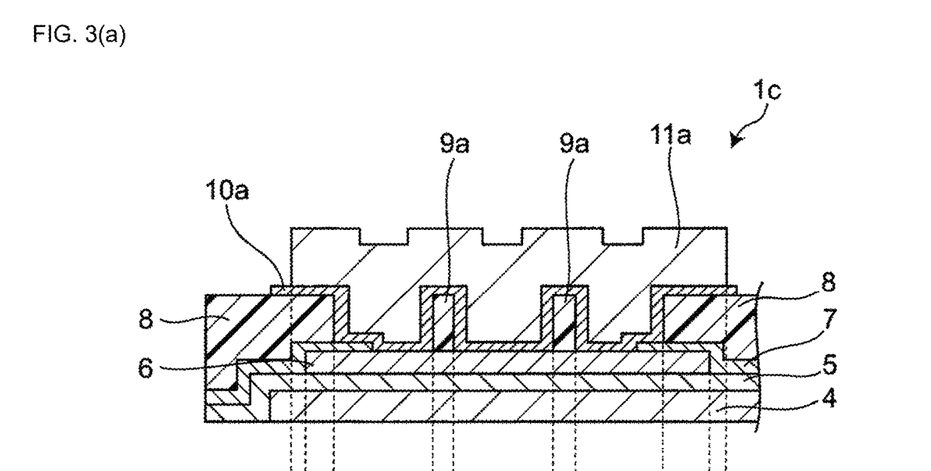
FIG. 3(a) is a cross-sectional view of a capacitor 1c according to a third embodiment of the present disclosure.
Figure 3B:
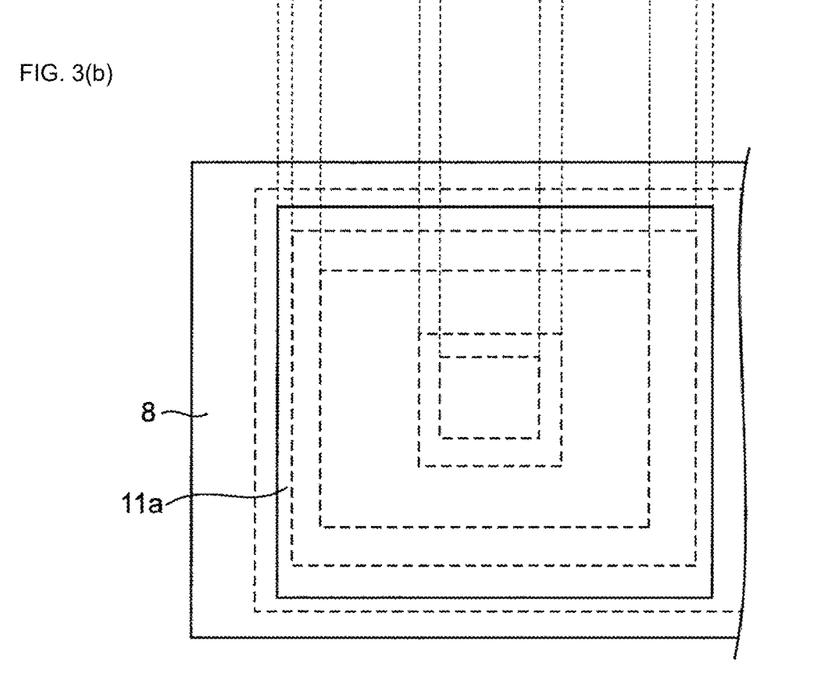
FIG. 3(b) is a plan view of the capacitor 1c.

FIG. 3(a) is a cross-sectional view of a portion of a capacitor 1c according to a third embodiment including a MIM structure, and FIG. 3(b) is a plan view of the capacitor 1c.

As illustrated in FIGS. 3(a) and 3(b), the capacitor 1c according to the third embodiment has the same structure as the capacitor 1a according to the first embodiment except that the protrusion 9a has a loop shape in a plan view. Although not illustrated, the protrusion 9b may similarly have a loop shape in a plan view. The protrusions 9a and 9b with a loop shape increase the uneven area of the outer electrodes 11a and 11b, increase the surface areas of the outer electrodes, and further improves the mounting workability.

In the illustrated example, the protrusion has a closed square shape in a plan view. The outer electrode over the protrusion also has a protruding portion with a closed square shape in a plan view. In the present embodiment, the shape or size of the loop formed by the protrusion is not limited to the illustrated example. For example, the loop may have any shape such as a circular, elliptical, or triangular shape.

Fourth Embodiment

Figure 4A:
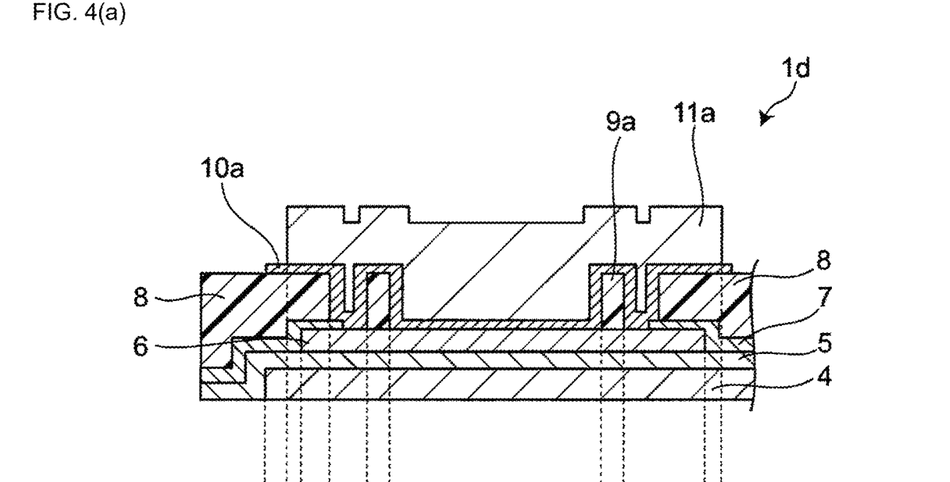
FIG. 4(a) is a cross-sectional view of a capacitor 1d according to a fourth embodiment of the present disclosure.
Figure 4B:
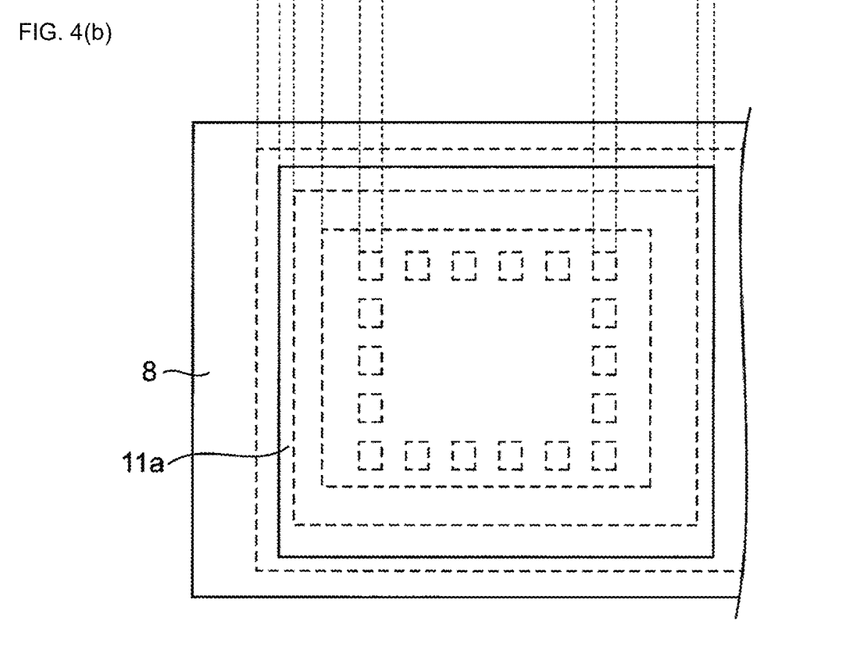
FIG. 4(b) is a plan view of the capacitor 1d.

FIG. 4(a) is a cross-sectional view of a portion of a capacitor 1d according to a fourth embodiment including a MIM structure, and FIG. 4(b) is a plan view of the capacitor 1d.

As illustrated in FIGS. 4(a) and 4(b), the capacitor 1d according to the fourth embodiment has the same structure as the capacitor 1a according to the first embodiment except that the capacitor 1d includes multiple protrusions 9a, and the protrusions are arranged on the peripheral portions in the through-holes in a plan view. Although not illustrated, the capacitor 1d may also include multiple protrusions 9b arranged on the peripheral portion in the through-hole, similarly to the protrusions 9a. This embodiment is similar to an aspect where multiple protrusions according to the second embodiment are disposed on the peripheral portion in the through-hole in a plan view. Providing the multiple protrusions 9a and 9b increases the projections and depressions on the surface of the outer electrodes 11a and 11b, increases the surface areas of the outer electrodes, and further improves the mounting workability. Disposing the protrusions on the peripheral portion in the through-hole allows the outer electrode formed on the protrusions to similarly have protruding portions on the peripheral portion, and to form flat center portions. This structure facilitates probing.

Fifth Embodiment

Figure 5A:
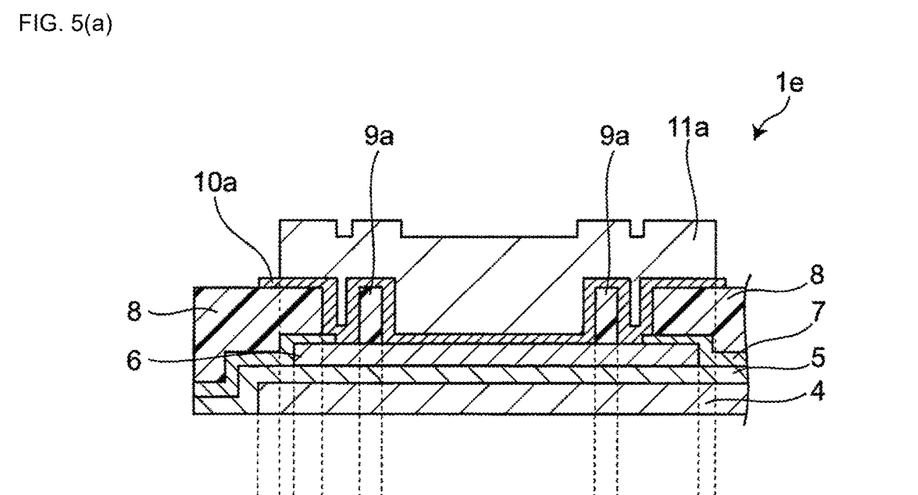
FIG. 5(a) is a cross-sectional view of a capacitor 1e according to a fifth embodiment of the present disclosure.
Figure 5B:
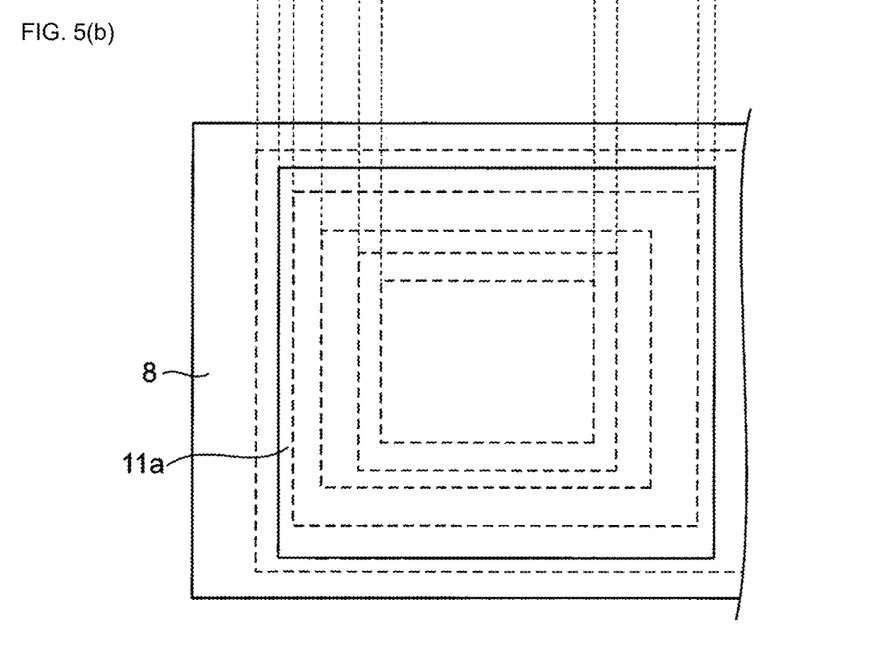
FIG. 5(b) is a plan view of the capacitor 1e.

FIG. 5(a) is a cross-sectional view of a portion of a capacitor 1e according to a fifth embodiment including a MIM structure, and FIG. 5(b) is a plan view of the capacitor 1e.

As illustrated in FIGS. 5(a) and 5(b), the capacitor 1e according to the fifth embodiment has the same structure as the capacitor 1a according to the first embodiment except that the protrusion 9a is disposed on the peripheral portion in the through-hole in a loop shape in a plan view. Although not illustrated, the protrusion 9b may similarly be disposed on the peripheral portion in the through-hole in a loop shape in a plan view. This aspect is similar to an aspect where the loop-shaped protrusion according to the third embodiment is disposed on the peripheral portion in the through-hole in a plan view. The protrusions 9a and 9b formed in a loop shape increase the uneven area of the outer electrodes 11a and 11b, increase the surface areas of the outer electrodes, and thus further improve mounting workability. The protrusions disposed on the outer peripheries of the through-holes allow the outer electrodes disposed thereon to similarly have a protruding shape on the peripheral portions, and to form flat center portions. This structure facilitates probing.

The "peripheral portion in the through-hole" here indicates an area that is one of equal six parts of opposing surfaces of a through-hole in a plan view and located closest to the side surfaces of the through-hole, or an area where part of the protrusion is formed within 30 μm from the side surfaces of the through-hole.

Sixth Embodiment

Figure 6:
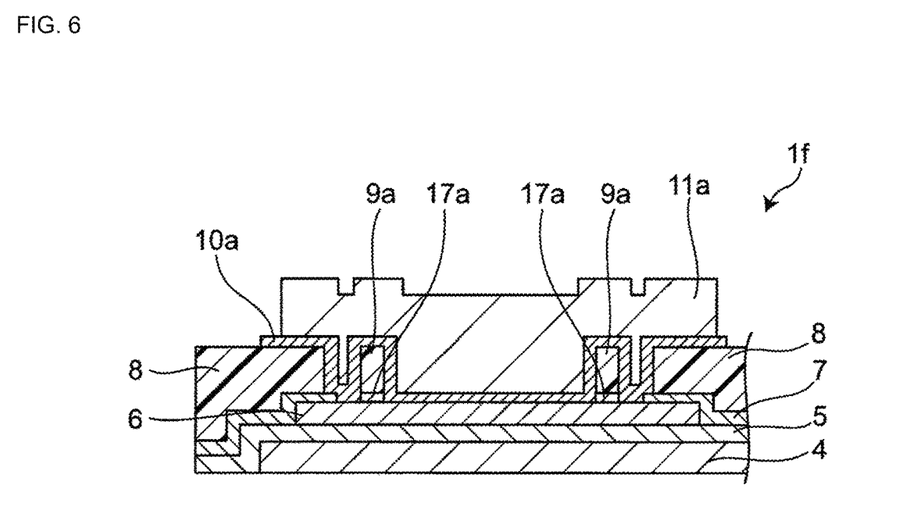
FIG. 6 is a cross-sectional view of a capacitor 1f according to a sixth embodiment of the present disclosure.

FIG. 6 is a cross-sectional view of a portion of a capacitor 1f according to a sixth embodiment including a MIM structure.

As illustrated in FIG. 6, the capacitor 1f according to the sixth embodiment has the same structure as the capacitor according to the fourth embodiment or the fourth embodiment except that a moisture-resistant film 17a is disposed between the protrusion 9a and the upper electrode 6. Although not illustrated, a moisture-resistant film may similarly be disposed between the protrusion 9b and the lower electrode 4. Providing a moisture-resistant film between the protrusion and the upper or lower electrode can prevent intrusion of water from the protrusion to the upper or lower electrode, improve moisture proof characteristics, and improve the reliability.

The moisture-resistant films may be formed concurrently with the moisture-resistant film 7, or may be formed separately. The material of the moisture-resistant films is the same as the material of the moisture-resistant film 7. The moisture-resistant films and the moisture-resistant film 7 may be formed from the same material or different materials, but are preferably formed from the same material.

Seventh Embodiment

Figure 7:
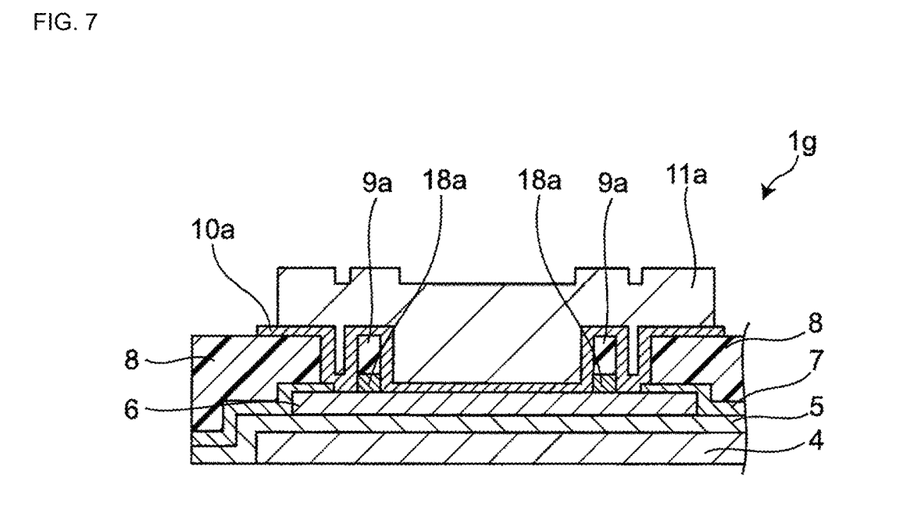
FIG. 7 is a cross-sectional view of a capacitor 1g according to a seventh embodiment of the present disclosure.

FIG. 7 is a cross-sectional view of a portion of a capacitor 1g according to a seventh embodiment including a MIM structure.

As illustrated in FIG. 7, the capacitor 1g according to the seventh embodiment has the same structure as the capacitor according to the sixth embodiment except that the moisture-resistant film 17a is replaced with a metal film 18a. Although not illustrated, a metal film may also be disposed between the protrusion 9b and the lower electrode 4. Preferably, the metal films are respectively in contact with and electrically connected to the seed layers 10a and 10b. Providing a metal film between the protrusion and the upper or lower electrode can increase the contact area between the outer electrode and the upper or lower electrode, and improve the Q value of the capacitor.

The metal films may be formed concurrently with the seed layer, or may be formed separately. The material of the metal films may be the same as the material of the lower electrode or the seed layer. In a preferable embodiment, the material of the metal films may be a metal with a low Young's modulus. When a load is imposed on the capacitor 1g, the metal material with a low Young's modulus reduces the load on the MIM structure, and improves the impact resistance.

Eighth Embodiment

Figure 8:
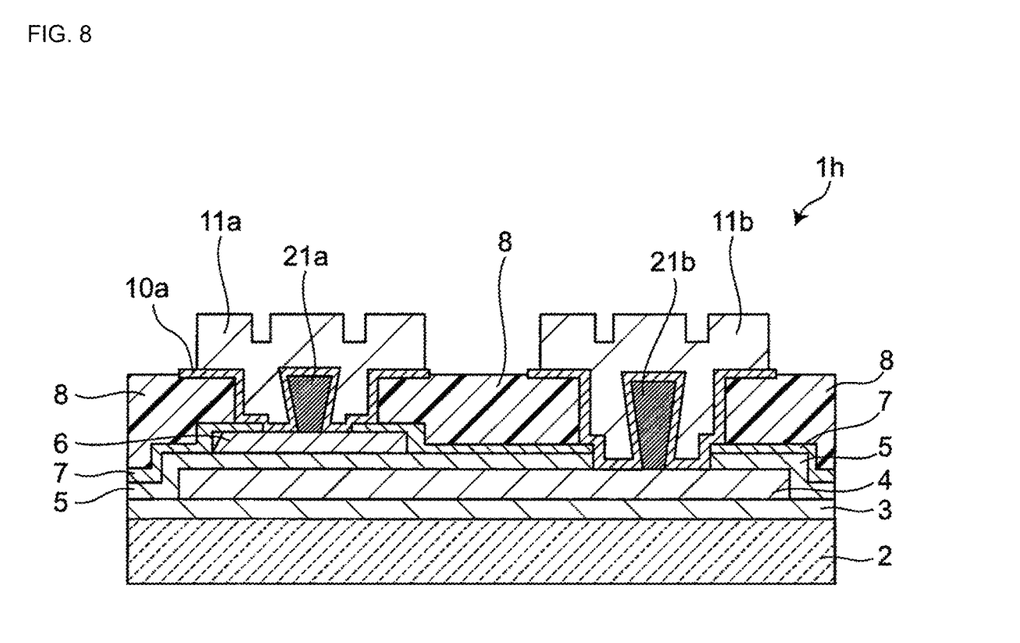
FIG. 8 is a cross-sectional view of a capacitor 1h according to an eighth embodiment of the present disclosure.

FIG. 8 is a cross-sectional view of a capacitor 1h according to an eighth embodiment.

As illustrated in FIG. 8, the capacitor 1h according to the eighth embodiment has the same structure as the capacitor 1a according to the first embodiment except that protrusions 21a and 21b are reverse-tapered. The reverse-tapered protrusions 21a and 21b can increase the contact area between the outer electrodes 11a and 11b and the seed layers 10a and 10b, and improve a Q value.

EXAMPLES

A capacitor illustrated in FIG. 4 was manufactured in accordance with the manufacturing method illustrated in FIG. 9 except that the number and arrangement of protrusions of the example were adjusted in accordance with the structure illustrated in FIG. 4. The structure of the manufactured capacitor is as follows.

Substrate: Silicon Substrate of 200 μm
Insulator Film: $SiO_2$ of 1 μm
Lower Electrode: Cu of 3 μm
Dielectric Film: $Si_3N_4$ of 3 μm
Upper Electrode: Cu of 3 μm
Moisture-Resistant Film: $SiO_2$ of 2 μm
Protective Layer: Polyimide
Protrusion: Polyimide
Seed Layer: Cu of 1 μm
Outer electrode: Ni—Au plating Comparative Example As a comparative example, a capacitor was manufactured similarly to the example except for forming no protrusions. The capacitor according to the comparative example had no projections and depressions caused by the protrusions, on the surface of the outer electrodes.

Test Example

The failure rates were examined for the cases where the capacitors according to the example and the comparative example thus obtained were mounted on the surface with a reflow process. More specifically, each capacitor was reflow-mounted with a mounter, and subjected to capacitance measurement. The capacitors that deviated from the reference value were counted as failures. The results are shown in the following table.

TABLE 1

|  | Number of Failures/Number of Capacitors Tested | Failure Rate |
| --- | --- | --- |
| Example | 0/1872 | 0% |
| Comparative Example | 10/1872 | 0.5% |

The capacitor of the present disclosure has high mounting workability, and is thus preferably applicable to various electronic devices.

REFERENCE SIGNS LIST 1 capacitor
2 substrate
3 insulator film
4 lower electrode
5 dielectric film
6 upper electrode
7 moisture-resistant film
8 protective layer
9a, 9b protrusion
10a, 10b seed layer
11a, 11b outer electrode
15a, 15b through-hole
17a moisture-resistant film
18a metal film
19a, 19b tapered protrusion
101 substrate
102 insulator film
103 lower electrode
104 dielectric film
105 upper electrode
106 protective layer
107a, 107b outer electrode
108a, 108b edge portion

The invention claimed is:

1. A capacitor, comprising:
a substrate having a surface;
a lower electrode opposing the surface of the substrate;
a dielectric film on the lower electrode;
an upper electrode on the dielectric film;
a protective layer on the lower electrode, the dielectric film, and the upper electrode, the protective layer defining a through-hole exposing at least one of the lower electrode and the upper electrode;
at least one protrusion in the through-hole, the at least one protrusion having a side surface within the through-hole; and
an outer electrode covering the through-hole and enclosing the side surface of the at least one protrusion,
wherein the at least one protrusion has a prism shape.

2. The capacitor according to claim 1, wherein the at least one protrusion with a prism shape is a plurality of protrusions each with a prism shape.

3. The capacitor according to claim 2, wherein the plurality of protrusions each with the prism shape are disposed along a peripheral portion in the through-hole.

4. The capacitor according to claim 1, wherein the at least one protrusion has a reversed-tapered shape.

5. The capacitor according to claim 1, further comprising a metal film between the at least one protrusion and the at least one of the lower electrode and the upper electrode exposed in the through-hole.

6. The capacitor according to claim 1, further comprising a moisture-resistant film between the at least one protrusion and the at least one of the lower electrode and the upper electrode exposed in the through-hole.

7. The capacitor according to claim 1, wherein the at least one protrusion comprises a resin.

8. The capacitor according to claim 1, wherein the at least one protrusion comprises a metal.

9. The capacitor according to claim 1, wherein the at least one protrusion comprises a moisture-resistant material.

10. The capacitor according to claim 1, further comprising a moisture-resistant film between the protective layer and the dielectric layer.

11. The capacitor according to claim 1, further comprising a seed layer between the outer electrode and the at least one protrusion.

12. The capacitor according to claim 1, wherein, in a plan view of the capacitor, the upper electrode is located in an area where the lower electrode is located, and the outer electrode is located in an area where the upper electrode is located.

13. The capacitor according to claim 1, wherein an upper surface of the protective layer and an upper surface of the at least one protrusion are flush with each other.

14. The capacitor according to claim 1, wherein
the through-hole is a first through hole exposing the lower electrode,
the at least one protrusion is at least one first protrusion in the first through hole,
the outer electrode is a first outer electrode covering the at least one first protrusion,
the protective layer defines a second through-hole exposing the upper electrode;
and the capacitor further comprises:
at least one second protrusion in the second through-hole; and
a second outer electrode covering the second through-hole and the at least one second protrusion.

15. The capacitor according to claim 14, wherein
the at least one first protrusion is disposed along a peripheral portion in the first through-hole, and
the at least one second protrusion is disposed along a peripheral portion in the second through-hole.

16. A capacitor, comprising:
a substrate having a surface;
a lower electrode opposing the surface of the substrate;
a dielectric film on the lower electrode;
an upper electrode on the dielectric film;
a protective layer on the lower electrode, the dielectric film, and the upper electrode, the protective layer defining a through-hole exposing at least one of the lower electrode and the upper electrode;
at least one protrusion in the through-hole; and
an outer electrode covering the through-hole and the at least one protrusion,
wherein a height of the at least one protrusion is 1.1 to 2.0 times a height of the through-hole.

17. The capacitor according to claim 16, wherein the at least one protrusion has a loop shape.

18. The capacitor according to claim 17, wherein the at least one protrusion with the loop shape is disposed along a peripheral portion in the through-hole.

19. A capacitor, comprising:
a substrate having a surface;
a lower electrode opposing the surface of the substrate;
a dielectric film on the lower electrode;
an upper electrode on the dielectric film;
a protective layer on the lower electrode, the dielectric film, and the upper electrode, the protective layer defining a through-hole exposing at least one of the lower electrode and the upper electrode;
at least one protrusion in the through-hole; and
an outer electrode covering the through-hole and the at least one protrusion,
wherein a height of the at least one protrusion is 0.3 to 0.9 times a height of the through-hole.

* * * * *